United States Patent
Nguyen

(12)
(10) Patent No.: US 6,452,525 B1
(45) Date of Patent: Sep. 17, 2002

(54) ONE-BIT SECOND ORDER SIGMA-DELTA MODULATOR INCLUDING A POLYNOMIAL VECTOR QUANTIZER

(75) Inventor: Truong-Thao Nguyen, Fort Lee, NJ (US)

(73) Assignee: Research Foundation of the City University of New York, New York, NY (US)

( * ) Notice: Subject to any disclaimer, the term of this patent is extended or adjusted under 35 U.S.C. 154(b) by 0 days.

(21) Appl. No.: 09/832,143

(22) Filed: Apr. 5, 2001

Related U.S. Application Data

(63) Continuation-in-part of application No. 09/805,744, filed on Mar. 13, 2001
(60) Provisional application No. 60/188,803, filed on Mar. 13, 2000.

(51) Int. Cl.[7] ................................. H03M 3/00
(52) U.S. Cl. .................... 341/143; 341/144; 341/155; 341/200; 341/51; 341/65; 341/67; 341/106; 341/118
(58) Field of Search .................. 341/143, 144, 341/155, 200

(56) References Cited

U.S. PATENT DOCUMENTS

| | | | | |
|---|---|---|---|---|
| 4,560,977 A | * | 12/1985 | Murakami et al. | 341/118 |
| 5,408,235 A | * | 4/1995 | Doyle et al. | 341/120 |
| 5,757,306 A | * | 5/1998 | Nomura | 341/200 |
| 6,300,892 B2 | * | 10/2001 | Braun | 341/143 |
| 6,346,898 B1 | * | 2/2002 | Melanson | 341/143 |

OTHER PUBLICATIONS

Lars Risbo, "Improved Stability and Performance from Sigma–Delta Modulators using 1–bit Vector Quantization", Electronics Institute, Technical University of Denmark, IEEE 1993, pp. 1365–1368.

* cited by examiner

Primary Examiner—Michael Tokar
Assistant Examiner—Lam T. Mai
(74) Attorney, Agent, or Firm—Darby & Darby

(57) ABSTRACT

A circuit for determining a discrete amplitude of a set of samples $x_k$s comprising two integrators that produce integrated signals $u_k$ and $v_k$, a converter which supplies an input to the first integrator, timing elements which produce delayed signals $u_{k-1}$ and $v_{k-1}$, and a vector quantizer $Q(x_k, u_{k-1}, v_{k-1})$ configured to provide a binary output as a function of samples $x_k$ and the integrated signals $u_{k-1}$ and $v_{k-1}$.

4 Claims, 11 Drawing Sheets

$$c_0(x_k) = 10 - 4 |x_k|$$
$$c_1(x_k) = 9 - 6 |x_k|$$
$$c_2(x_k) = 6 - 12 |x_k|$$

$q_k =$ "1" if $y_k > 0$
"0" if $y_k < 0$

} 436

$$S_k = \begin{Bmatrix} 1 & \text{if } X_k > 0 \\ -1 & \text{if } X_k < 0 \end{Bmatrix} \quad 636$$

$c_0(x_k) = 14b - 3|x_k|$
$c_1(x_k) = 12b - 4|x_k|$
$c_2(x_k) = 8b - 8|x_k|$ $q_k$ = "1" if $y_k > 0$
      "0" if $y_k < 0$

ONE-BIT SECOND ORDER SIGMA-DELTA MODULATOR INCLUDING A POLYNOMIAL VECTOR QUANTIZER

CROSS-REFERENCE TO RELATED APPLICATIONS

This application claims the benefit of priority from continuation-in-part U.S. patent application Ser. No. 09/805,744 entitled "Polynomial One-bit Second Order Sigma-delta Modulator," filed Mar. 13, 2001, and to provisional application 60/188,803 applicant filed Mar. 13, 2000, Troung-Thao Nguyen, the disclosure of which is incorporated herein by reference in its entirety.

FIELD OF THE INVENTION

The invention relates generally to the field of analog-to-digital ("A/D") or digital-to-analog ("D/A") signal conversion. More particularly, the invention relates to a system and method for digitizing the amplitude of a stream of digitized samples using a one-bit $2^{nd}$ order sigma delta modulator ("ΣΔ modulation").

BACKGROUND OF THE INVENTION

In a typical analog to digital signal conversion, analog signals ("x(t)") are sampled and then transformed into digital signal ("x^k") equivalents. Analog signals, x(t), are both continuous in time and in amplitude. In order to properly digitize an analog signal, the analog signal's amplitude and time must be digitized. Sigma delta modulators digitize the analog signal's amplitude.

The maximum frequency for an analog signal, x(t), is known as $f_{max}$. Analog signals include, but are not limited to, audio signals. An exemplary audio signal $f_{max}$=20,000 Hertz. The rate at which analog signals are sampled is known as $f_{samp}$. Once an analog signal has been sampled, the original signal which was both continuous in time and amplitude is now represented as a set of numbers ("$x_k$") which is no longer continuous in time. The set of numbers, $x_k$, is represented as $$x_k = x(k/f_{samp}) \quad \text{(Equation 1)}$$

where k=0, 1, 2, 3 and $f_{samp}$=constant.

It is well known in the art that if $$f_{samp} > 2 f_{max} \quad \text{(Equation 2)}$$

it is possible to recover the original analog x(t) signal from the signal set, $x_k$. After the analog signal, x(t), has been sampled and converted into the sequence of numbers $x_k$, the signal is feed into a ΣΔ modulator which digitizes the amplitude of the signal set $x_k$. The ΣΔ modulator produces an output $q_k$ which is a sequence of samples that is both discrete in time and in amplitude. Because the ΣΔ modulator distorts the $x_k$ sequence, $q_k$ is fed into a lowpass filter. If a ΣΔ modulator is properly designed, a good approximation of $x_k$ can be recovered from $q_k$ This is accomplished by lowpass filtering the $q_k$ signal with a cutoff frequency ("$f_{cutoff}$") equal to $f_{max}$. A ΣΔ modulator's performance is measured by evaluating the time-average of the squared error $(\hat{x}_k - x_k)^2$, called the "mean squared error" ("MSE"). In practice, the MSE results in the perception of noise. Therefore, to avoid additional signal imperfections, the MSE should be minimized as much as possible.

There are various types of ΣΔ modulators which approximate and digitize a signal's amplitude. One bit ΣΔ modulators, output two discrete levels of signals, while "multi-bit" ΣΔ modulators output more than two discrete levels of signals. Theoretically, multi-bit ΣΔ modulators out-perform one-bit ΣΔ modulators. In other words, theoretically, the MSE in multi-bit ΣΔ modulators is less than the MSE in one bit ΣΔ modulators. However, practically speaking, multi-bit ΣΔ modulators have complex circuit designs and are sensitive to analog circuit imperfections. "Nth order" ΣΔ modulators include nth order integrators. Once again, the higher the order, the higher the theoretical performance, however, high order ΣΔ modulators, when implemented, have complex circuit designs. The preferred embodiment of the present invention improves the one-bit $2^{nd}$ order ΣΔ modulator.

Prior art versions of ΣΔ modulators were primarily linear and time-invariable. The only exception to the linear constraint was quantization, which was non-linear. Consequently, besides quantization, the building blocks of prior art ΣΔ modulators were limited to linear functions such as delay operators ("D"), constant coefficient multipliers, and signal additions.

Nonlinear circuits add errors to input error signals which human ears detect and can be annoyed by. These error signals are called "harmonics." A/D conversion requires nonlinear quantization. However, because quantization is incorporated in the feedback process of a ΣΔ modulator, the error that the quantizer generates becomes background noise. Human ears are less sensitive to this background noise. The present invention incorporates this concept.

In conclusion, prior art versions of one-bit $2^{nd}$ order ΣΔ modulators perform with an MSE decay rate of 12 dB/octave, while prior art versions of multi-bit $2^{nd}$ order ΣΔ modulators achieve the preferred 15 dB/octave MSE decay rate. However, multi-bit ΣΔ modulators are more sensitive to analog circuit imperfection and are complex to construct.

What is needed in the art is an improved one-bit ΣΔ modulator, which the present invention provides.

SUMMARY OF THE INVENTION

These and other problems are addressed by the ΣΔ modulator of the present invention. The present invention utilizes the understanding that nonlinear operations incorporated into the feedback process of a ΣΔ modulator generate background noise which is generally acceptable to human ears. The present invention incorporates this understanding in the circuit design of the present invention to emulate a near ideal MSE decay rate. The present invention expands the acceptance of non-linear operations in the ΣΔ modulator's feedback loop by incorporating circuitry to implement the following equations in the ΣΔ modulator's vector quantizer:

$$Q(x_k, u_{k-1}, v_{k-1}) = \text{quant}[(7-3|x_k|)x + (6-4|x_k|)u_{k-1} + (4-8|x_k|)v_{k-1} + \text{sign}(x_k)(4(x_k + u_{k-1})^2 - 1/12)] \quad \text{(Equation 3)}$$

$$Q(x_k, u_{k-1}, v_{k-1}) = \text{quant}[(10-4|x_k|)x_k + (9-6|x_k|)u_{k-1} + (6-12|x_k|)v_{k-1}] \quad \text{(Equation 4)}$$

$$Q(x_k, u_{k-1}, v_{k-1}) = \text{quant}[(14b-3|x_k|)x + (12b-4|x_k|)u_{k-1} + (8b-8|x_k|)v_{k-1} + \text{sign}(x_k)(4(x_k + u_{k-1})^2 - b^2/3)] \quad \text{(Equation 5)}$$

$$Q(x_k, u^{k-1}, v_{k-1}) = \text{quant}[(20b-4|x_k|)x_k + (18b-6|x_k|)u_{k-1} + (12b-12|x_k|)v_{k-1}] \quad \text{(Equation 6)}$$

wherein the quant function is defined as quant(y)="1" if y>0 and quant(y)="0" if y<0.

The ΣΔ modulator of the present invention reduces circuit complexity by outputting only two discrete signal levels. Consequently, the $2^{nd}$ order ΣΔ modulator of the present invention is a one-bit modulator design. Accordingly, the circuitry involved with the ΣΔ modulator of the present invention is less complex and is less susceptible to analog circuit imperfections. In addition, the ΣΔ present invention achieves the MSE decay rate of prior art multi-bit modulators using only one bit. Thus, the present invention achieves the ideal MSE decay rate of 15 dB/octave without the complex circuitry and increased sensitivity to circuit imperfections when using multi-bits.

As mentioned above, the MSE decay of 12 dB/octave is the limit for prior art one-bit $2^{nd}$ order ΣΔ modulators. This is because the only non-linear operation in prior art ΣΔ modulators was quantization. A linear operation has 3 forms: multiplication by a constant, additions of signals, or delay of a signal. The present invention is a new type of ΣΔ modulator in which both the quantizer and the vector quantizer ("Q"), that includes the quantizer, is non-linear. A quantizer is represented by a comparator in ΣΔ modulator designs. The ΣΔ modulator, according to the present invention, departs from the prior art theory that the quantizer can be the only non-linear function in a ΣΔ modulator. In its novel construction, the present invention includes a vector quantizer that breaks the 12 dB/oct barrier of known prior art one-bit $2^{nd}$ order ΣΔ modulators. A vector quantizer of the preferred embodiment includes both the standard quantizer as well as has additional non-linear circuitry.

The ΣΔ modulator of the present invention has a vector quantizer, Q, which is memoriless. Memoriless means that, at every instant, the outputs of the vector quantizer, Q, are a function of only the instantaneous values of the inputs, and not a function of past input values. The vector quantizer, Q, of the present invention is a "memoriless" 3-input function that outputs binary numbers at two discrete levels. Prior art ΣΔ modulators have constrained quantizers where the output is multiplied by the sign of a linear combination of its inputs. The output of the vector quantizer of the present invention, $Q(x_k, u^{k-1}, v_{k-1})$, is multiplied by the quantization of a polynomial function to the degree necessary in which to achieve the ideal MSE decay rate. This amounts to quantizing a $1^{st}$ degree polynomial function of the inputs. This MSE decay rate can be achieved using a polynomial to the $2^{nd}$ degree. Mathematical derivations lead to the following vector quantizer functions:

$$Q(x_k, u_{k-1}, v_{k-1})=\text{quant}[(7-3|x_k|)x_k+(6-4|x_k|)u_{k-1}+(4-8|x_k|)v_{k-1}+\text{sign}(x_k)(4(x_k+u_{k-1})^2-1/12)] \quad \text{(Equation 3)}$$

$$Q(x^k, u_{k-1}, v_{k-1})=\text{quant}[(10-4|x_k|)x_k+(9-6|x_k|)u_{k-1}+(6-12|x_k|)v_{k-1}] \quad \text{(Equation 4)}$$

$$Q(x_k, u_{k-1}, v_{k-1})=\text{quant}[(14b-3|x_k|)x+(12b-4|x_k|)u_{k-1}+(8b-8|x_k|)v_{k-1}+\text{sign}(x_k)(4(x_k+u_{k-1})^2-b^2/3)] \quad \text{(Equation 5)}$$

$$Q(x_k, u_{-k-1}, v_{k-1})=\text{quant}[(20b-4|x_k|)x_k+(18b-6x_k)u_{k-1}+(12b-12|x_k|)v_{k-1}] \quad \text{(Equation 6)}$$

wherein the quant function is defined as quant(y)="1" if y>0 and quant(y)="0" if y<0. Were there any further reduction of the quadratic functions complexity, the polynomial function would only be to the $1^{st}$ degree. This would turn the one bit $2^{nd}$ order ΣΔ modulator of the present invention into a linearly constrained circuit of prior art ΣΔ modulators. Thus, the polynomial function of the quantizer according to the invention is non-linear and can achieve an MSE decay rate of up to 15dB/octave.

BRIEF DESCRIPTION OF THE DRAWINGS

The foregoing and other features of the present invention will be more readily apparent from the following detailed description and drawings of illustrative embodiments the invention wherein like reference numbers refer to similar elements throughout the several views and in which.

DETAILED DESCRIPTION OF THE PREFERRED EMBODIMENT(S)

By way of overview, a preferred embodiment of the present invention involves an improved ΣΔ modulator design. The improved ΣΔ modulator design emulates a near ideal MSE decay rate previously accomplished only with multi-bit ΣΔ modulators. The preferred embodiment of the present invention avoids the complex circuitry customarily associated with multi-bit modulators by substituting a single bit ΣΔ modulator design. The ΣΔ modulator of the preferred embodiment emulates a near ideal MSE decay rate of prior art multi-bit ΣΔ modulators through circuitry that implements the following functions:

$$Q(x_k, u_{k-1}, v_{k-1})=\text{quant}[(7-3|x_k|)x_k+(6-4x_k)u_{k-1}+(4-8|x_k|)v_{k-1}+\text{sign}(x_k)(4(x_k+u_{k-1})^2-1/12)] \quad \text{(Equation 3)}$$

$$Q(x_k, u_{k-1}, v_{k-1})=\text{quant}[(10-4x_k)x_k+(9-6|x_k|)u_{k-1}+(6-12|x_k|)v_{k-1}] \quad \text{(Equation 4)}$$

$$Q(x_k, u_{k-1}, v_{k-1})=\text{quant}[(14b-3|x_k|)x+(12b-4|x_k|)u_{k-1}+(8b-8|x_k|)v_{k-1}+\text{sign}(x_k)(4(x_k+u_{k-1})^2-b^2/3)] \quad \text{(Equation 5)}$$

$$Q(x_k, u_{k-1}, v_{k-1})=\text{quant}[(20b-4|x_k|)x_k+(18b-6|x_k|)u_{k-1}+(12b-12|x_k|)v_{k-1}] \quad \text{(Equation 6)}$$

wherein the quant function is defined as quant(y)="1" if y >0 and quant(y)="0" if y <0.

Figure 1:
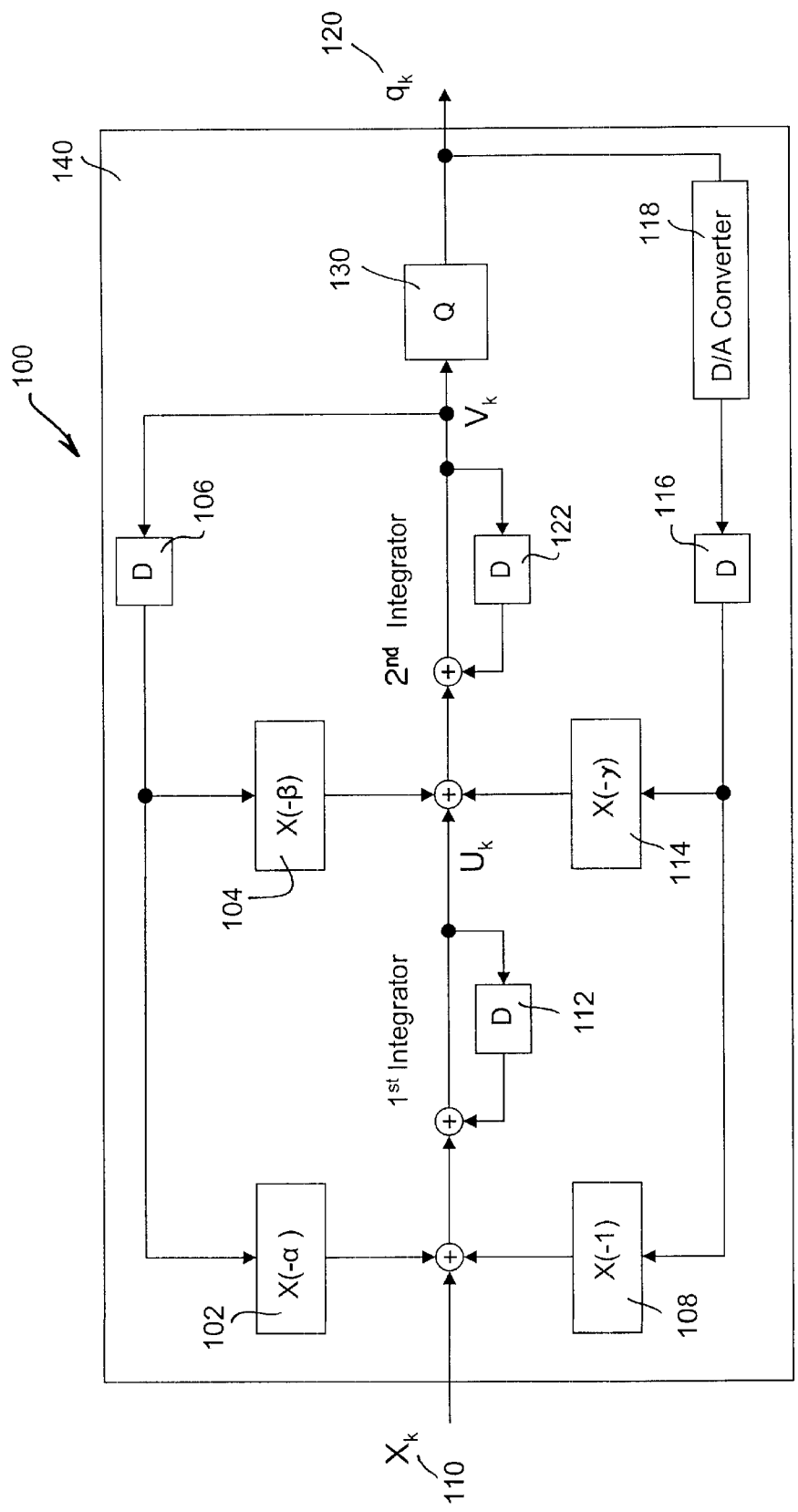
FIG. 1 is a circuit diagram which depicts a prior art $2^{nd}$ order ΣΔ modulator.

FIG. 1 depicts the prior art $2^{nd}$ order ΣΔ modulator. As can been seen from the prior art modulator of FIG. 1, aside from the vector quantizer 130, the circuit is linear. As mentioned above linear circuits can only multiply by a constant, sum two signals or delay a signal. As can be seen all of the blocks operate one of these three functions. The −α 102, −β 104, and the −γ 114 boxes all multiply signals by constants which are represented as $\alpha$, $\beta$, and $\gamma$. In addition, as seen by the nodes in FIG. 1, all the operational nodes add. Note that in FIG. 1, two integrators are shown, which makes the prior art $\Sigma\Delta$ modulator of FIG. 1 a $2^{nd}$ order modulator. One can show that the $\Sigma\Delta$ modulator of FIG. 1 has the form of a preferred embodiment of the present invention as seen in FIG. 3 when $\alpha=\beta=0$ and $\gamma=1$.

Figure 2:
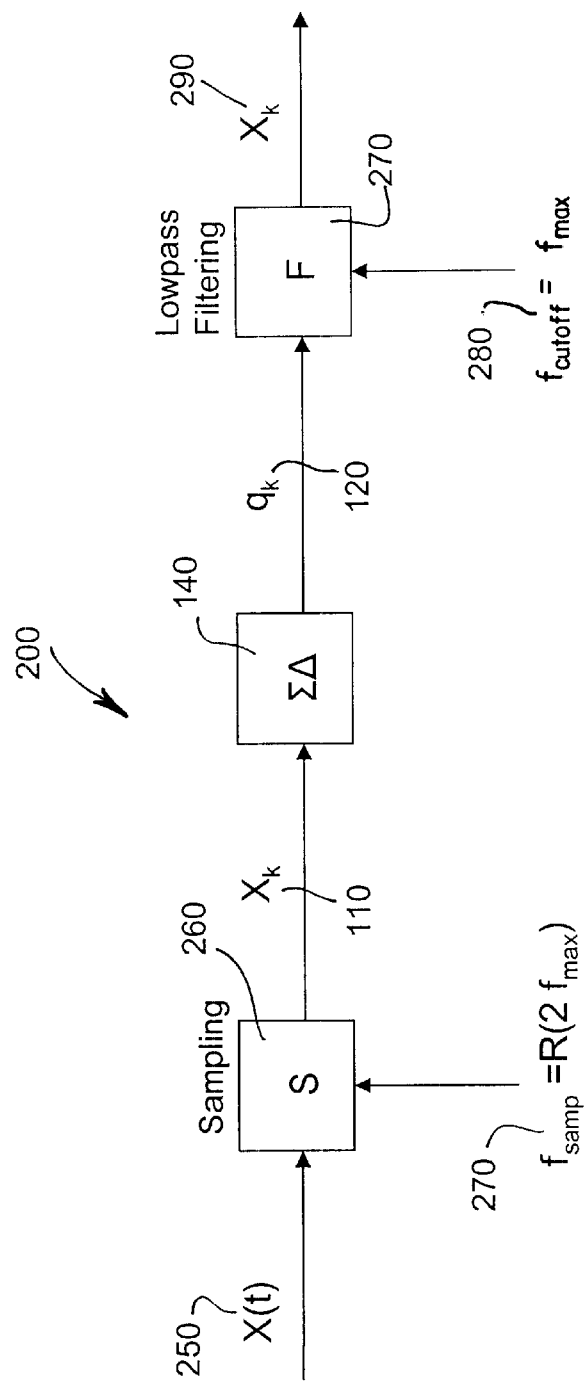
FIG. 2 is a circuit diagram depicting the standard analog to digital signal conversion.

FIG. 2 is a circuit diagram depicting standard analog to digital signal conversion. The x(t) 250 input to the sampling function 260 is an analog signal which is continuous in both time and amplitude. Upon being sampled at a rate of $f_{samp}$ R($2f_{max}$) 270 the original analog x(t) signal is now continuous is amplitude only. The oversampling ratio, R, is a coefficient which is greater than one such that $f_{samp}$=R($2f_{max}$). This continuous in amplitude only signal is known as $x_k$ 110. The $x_k$ 110 signal is a set of numbers which when fed into the $\Sigma\Delta$ modulator 140 results in a signal $q_k$ 120 which is both discrete in time and amplitude. The $q_k$ 120 signal is a one bit sequence which becomes the input to the lowpass filter 270. The lowpass filter 270 returns x^k 290 which is a multi-bit high resolution signal. The performance of a $\Sigma\Delta$ modulator 140 depends upon how closely x^k 290 matches $x_k$ 110

Figure 3:
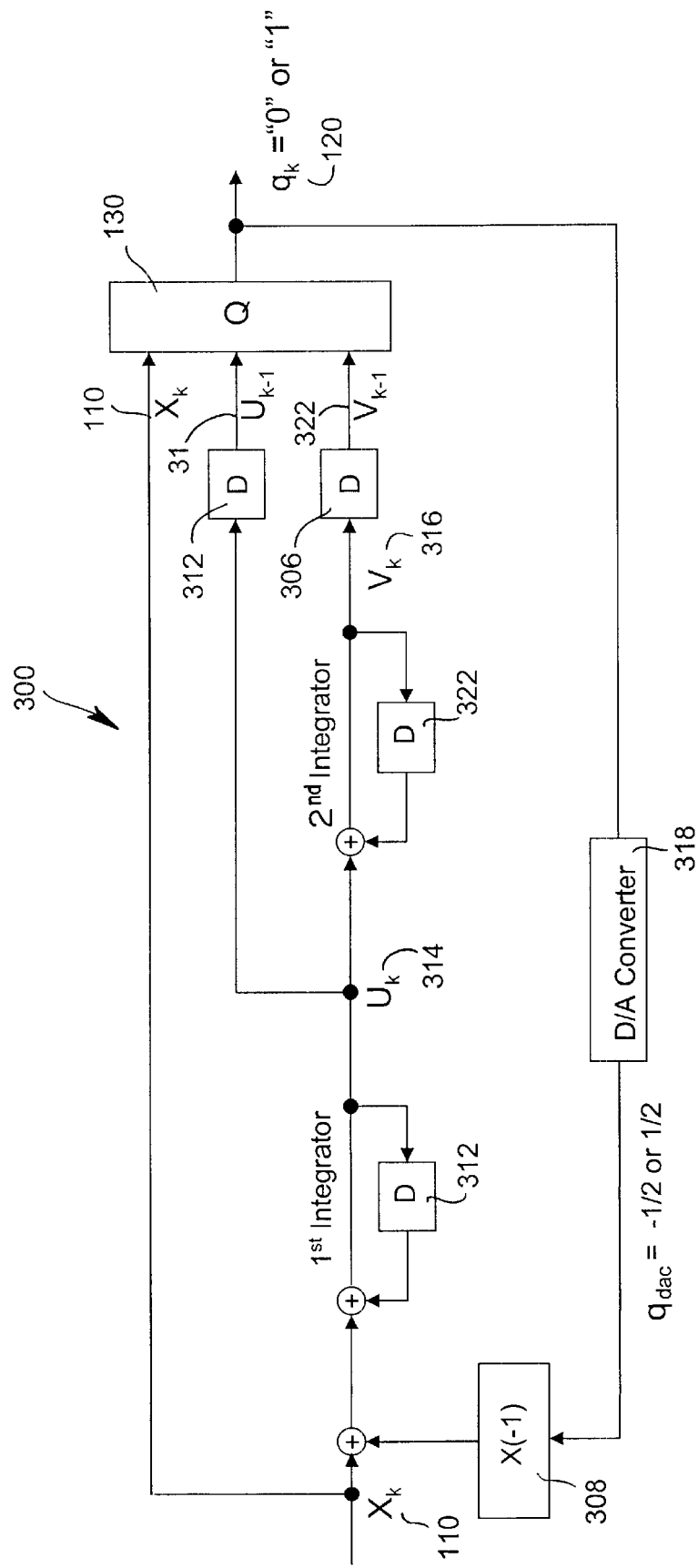
FIG. 3 is a circuit diagram of the operating environment for the ΣΔ modulator according to a preferred embodiment of the present invention.

FIG. 3 depicts a circuit diagram demonstrating an exemplary operating environment for the $\Sigma\Delta$ modulator 140 according to a preferred embodiment of the present invention. The input, $x_k$ 110, is a set of numbers which is feed into the vector quantizer 130 producing the binary output, $q_k$ 120 which is either logical one or zero. The delay block 312 sends the delayed signal $u_{k-1}$ 318 into the input to the vector quantizer 130, while the delay block 306 sends the delayed signal $v_{k-1}$ 322 into the input to the vector quantizer 130. As mentioned above, the $\Sigma\Delta$ modulator according to a preferred embodiment of the present invention is a second order circuit design. This $\Sigma\Delta$ modulator is considered a second order design because there are two integrators in the circuit. The first integrator is represented by the delay block 312, while the $2^{nd}$ integrator is represented by delay block 322. While the $q_k$ output 120 to the vector quantizer 130 is either logical "0" or "1," a digital to analog converter 318 converts the logical $q_k$ values 120 into $-\frac{1}{2}$ or $\frac{1}{2}$ respectively. The $q_{dac}$ values re-enter the circuit in the feedback loop after being multiplied by the constant, negative one, 308. This feedback loop, also known as, a negative feedback loop, prevents circuit divergence and maintains circuit stability.

Figure 4:
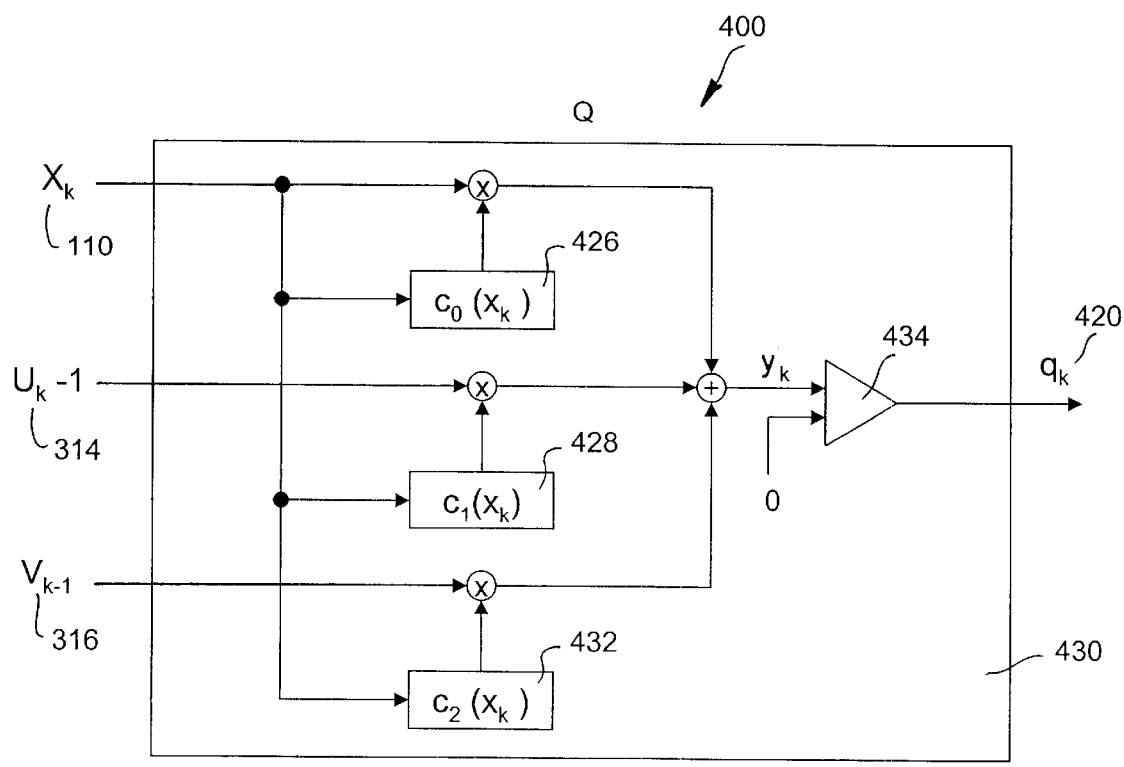
FIG. 4 is a further exemplary circuit diagram of the vector quantizer "Q", displayed in FIG. 3 useful for implementing a preferred embodiment of the present invention.

FIG. 4 depicts an exemplary circuit diagram of the nonlinear vector quantizer 430 displayed in FIG. 3 useful for implementing a preferred embodiment of the present invention. FIG. 4 demonstrates the circuit implementation of the vector quantizer 430 function:

$$Q(x_k, u_{k-1}, v_{k-1})=\text{quant}[(10-4|x_k|)x_k+(9-6|x_k|)u_{k-1}+(6-12|x_k|)v_k] \quad \text{(Equation 4)}$$

Figure 5:
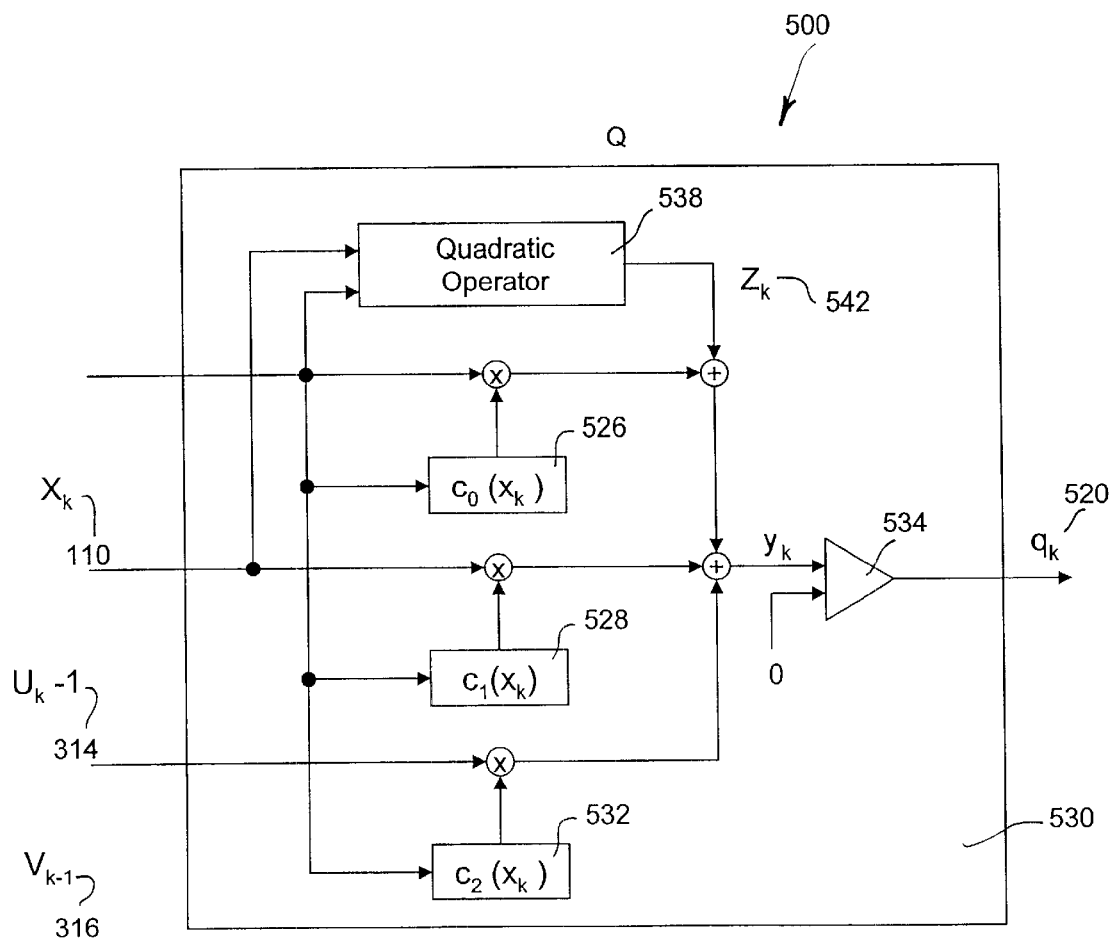
FIG. 5 is an exemplary circuit diagram of the vector quantizer "Q", displayed in FIG. 3 useful for implementing another embodiment of the present invention.

Once again, the vector quantizer 430 maintains the three input function seen in FIG. 3. In FIG. 4, the three inputs are represented by $x_k$, $u_{k-1}$, and $v_{k-1}$. The equation list 436 depicts the values of coefficient boxes $c_0(x_k)$ 426, $c_2(x_k)$ 428 and $c_2(x_k)$ 432. As can be seen when later looking at FIG. 5, FIG. 4 is a simplified vector quantizer 430 circuit. Note that the vector quantizer 430 depicted in FIG. 4 is nonlinear in two capacities. First, the vector quantizer of FIG. 4 contains the standard quantizer represented as a comparator 434. As mentioned above the standard quantizer 434 was the only nonlinear device in prior art sigma delta modulators. In addition, the circuitry shown in FIG. 4 implements equation 4 which is a polynomial function of second degree, consequently the exemplary embodiment of the present invention is non-linear in a second capacity. The vector quantizer of FIG. 4, contains the coefficient boxes $c_0(x_k)$ 426, $C_1(x_k)$ 428, and $c_2(x_k)$ 432 which each represent non-linear functions when multiplied by $x_k$ 110, $u_{k-1}$ 314, and $v_{k-1}$ 316 respectively. The values for the $c_0(x_k)$ 426 $c_1(x_k)$ 428 and $c_2(x_k)$ 432 coefficient boxes can be determined by examining the equation list 436. An input to the comparator, $y_k$, represents the summation of $(x_k \mathbf{110})(c_0(x_k))$ and $(c_1(x_k) \mathbf{428})(v_{k-1} \mathbf{314})$ and $(v_{k-1} \mathbf{316})(c_2(x_k))$. The output of the comparator $q_k$ 420 returns a binary number which will be either logical one or zero. As shown in FIG. 4, the input $y_k$ of the standard quantizer 434 is greater than zero, logical one will be outputted, but if the input $y_k$ is less than zero, logical zero will be outputted. Logical one or zero re-enter the circuit through the negative feedback loop and are converted by the digital to analog converter 318 to real values "½" or "–½" as depicted in FIG. 3.

FIG. 5 depicts another exemplary circuit diagram of the vector quantizer 530 displayed in FIG. 3 useful for implementing a preferred embodiment of the present invention. FIG. 5 demonstrates the circuitry used to implement the equation:

$$Q(x_k, u_{k-1}, v_{k-1})=\text{quant}[(7-3|x_k|)x+(6-4|x_k|)u_{k-1}+(4-8|x_k|)v_{k-1}+\text{sign}(x_k)(4(x_k+u_{k-1})^2-\tfrac{1}{12})] \quad \text{(Equation 3)}$$

Both FIG. 4 and FIG. 5 demonstrate exemplary embodiments of the present invention. The advantage of the FIG. 5 circuit is that it guarantees mathematically an MSE decay rate of 15 dB/octave at all oversampling ratios. The system of FIG. 4 only yields an MSE decay rate of 12 dB/octave at high oversampling ratios. However, at practical values of oversampling ratios (of the order of 1000 Hz and below), the FIG. 4 system appears to yield an MSE that is very close to the MSE of the FIG. 5 system. In other words, the MSE performances of the two systems, FIG. 5 and FIG. 4, are the same in practical situations. The advantage of the FIG. 4 system over FIG. 5 is FIG. 4's simple circuit implementation.

The vector quantizer 530 depicts coefficient values in the $c_0(x_k)$ box 526, $c_1(x_k)$ box 528, and $c_2(x_k)$ box 532. As seen in FIG. 4, coefficient boxes, $c_0(x_k)$ 526, $c_1(x_k)$ 528, $c_2(x_k)$ 532 all represent function equations as in the equation list 536 which are multiplied by the input $x_k$ 110, $u_{k-1}$ 314, and $v_{k-1}$ 316 respectively. Thus, just as in FIG. 4, FIG. 5 represents nonlinear operations in at least two ways. First, the standard quantizer/comparator 534 is shown. Second, the polynomial equation of $2^{nd}$ degree is depicted by the multiplication of the three inputs by the coefficient boxes, 526, 528, and 532. The feature new to FIG. 5 is the quadratic operator 538. This quadratic operator 538 accepts the $x_k$ and $u_{k-1}$ inputs and sends a $z_k$ output to the $y_k$ input to the comparator. The quadratic operator 538 adds an additional non-linear feature to the vector quantizer 530 which will be discussed in FIG. 6. As was seen before in FIG. 4, the $y_k$ input to the comparator 534 determines whether or not the $q_k$ output 520 will be logical one or zero. Like before, the equation list 536 demonstrates that if the real value $y_k$ is greater than one, $q_k$ will be a logical one and if the real value $y_k$ is less than zero, $q_k$ will be logical zero. A real number, $y_k$, consists of the ($z_k$ added to ($x_k$ 110) multiplied by ($c_0(x_k)$ 526)), added to the ($u_k$ 314 multiplied by $C_1(x_k)$ 528), and added to ($C_2(x_k)$ 532 multiplied by $v_k$ 316).

Figure 6:
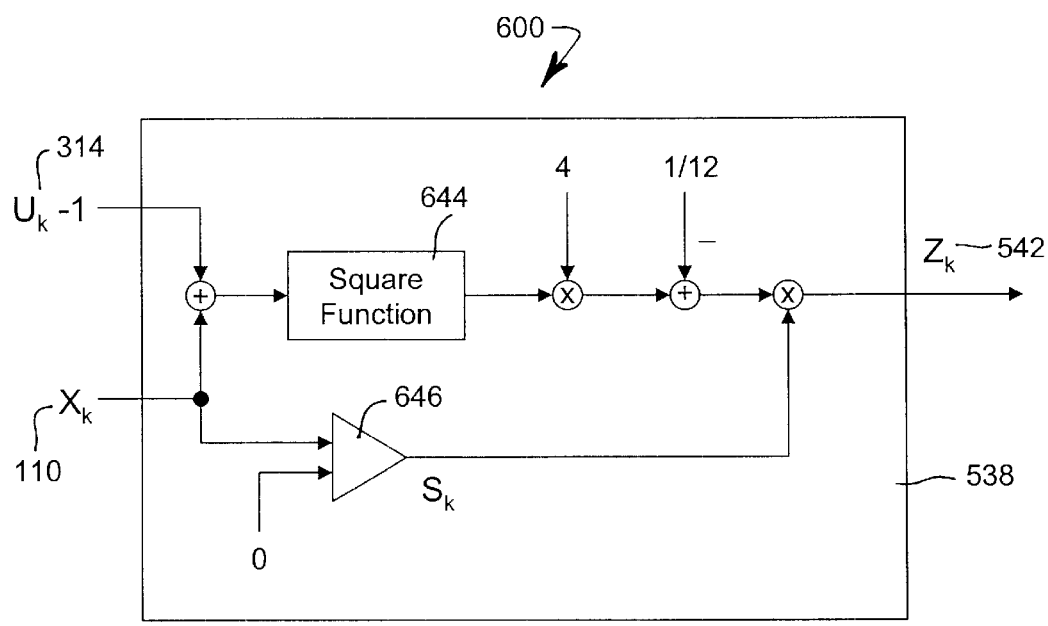
FIG. 6 is an exemplary circuit diagram of the quadratic operator displayed in FIG. 5 useful for implementing an embodiment of the present invention.

FIG. 6 depicts an exemplary circuit diagram of the quadratic operator 538 displayed in FIG. 5 useful for implementing the circuit shown in FIG. 5. As can be seen in FIG. 6, the same inputs to the quadratic operator 538 of FIG. 5 are in FIG. 6. The inputs are $u_{k-1}$ and $x_k$. As mentioned above, the vector quantizer of FIG. 5 is more complex than the vector quantizer of FIG. 4. This is more clearly depicted in FIG. 6 which demonstrates the quadratic operator's 538 circuitry. Note that in the vector quantizer 530 of FIG. 5, there are two comparator's involved. FIG. 5 has the standard comparator 534 which outputs logical one and zero as well as the quadratic operator's comparator 646 which outputs, $s_k$, real number values 1 and −1. The vector quantizer 530 of FIG. 6 demonstrates the function $QO(x_k, u_{k-1})$. The function $QO(x_k, u_{k-1})$ is:

$$QO(x_k, u_{k-1}) = \text{sign}(x_k)(4(x_k+u_{k-1})^2 - 1/12) \quad \text{(Equation 7)}$$

As can be seen in FIG. 6, the inputs $u_{k-1}$ 314 and $x_k$ 110 are both summed together and then squared 644. Then $(u_{k-1}$ 314 and $x_k$ 110$)^2$ is multiplied by the constant 4 and the constant 1/12 is then subtracted from it. The last operation on the $u_{k-1}$ and $x_k$ inputs is a multiplication by the 1 or −1 output of the comparator. The output of the vector quantizer 538 is $z_k$ 542. The $z_k$ output is feed back into the circuit as shown in FIG. 5.

Figure 7:
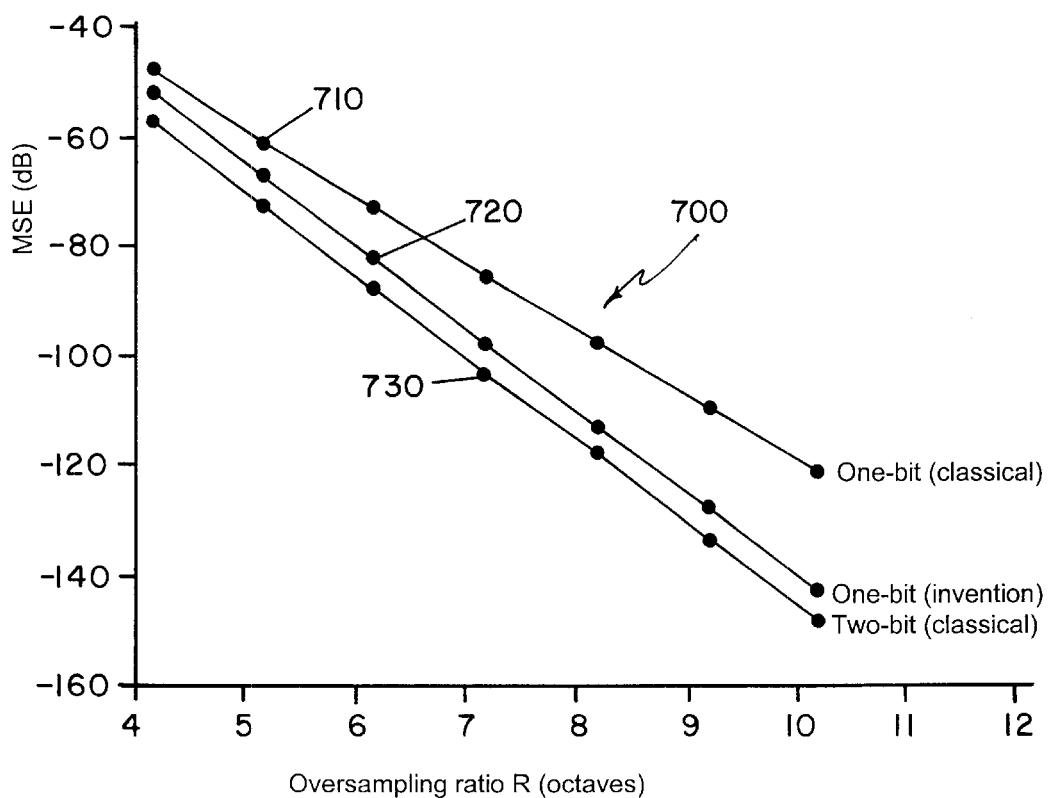
FIG. 7 is a graph depicting the MSE (dB) decay rate of prior art one-bit and the two-bit modulators as well as the MSE (dB) decay rate of a preferred embodiment of the present invention.

The performance of prior art $2^{nd}$ order ΣΔ modulator is shown in FIG. 7 by plotting the MSE in decibels (dB) as a function of the oversampling ratio $R = f_{samp}/2f_{max}$ in octaves. The number of octaves of R is obtained by taking log (R)/log(2). FIG. 7 shows more precisely the MSE yielded by the prior art one-bit and two-bit ΣΔ modulators. The prior art one-bit and two-bit versions are labeled as "classical" in FIG. 7. As would be expected in oversampled A/D and D/A conversion, the MSE decays when R increases. What makes the difference in performance between the various ΣΔ modulation schemes is the rate of the decay with R. With time-varying inputs, experimental results show that the MSE decay rate is 12 dB/octave of oversampling in the prior art one-bit case, while it is faster at 15 dB/octave in the prior art two-bit case. As shown by the experimental results of FIG. 7, ΣΔ modulator of the present invention achieves the same MSE decay rate as the two-bit linear prior art ΣΔ modulators.

Figure 8:
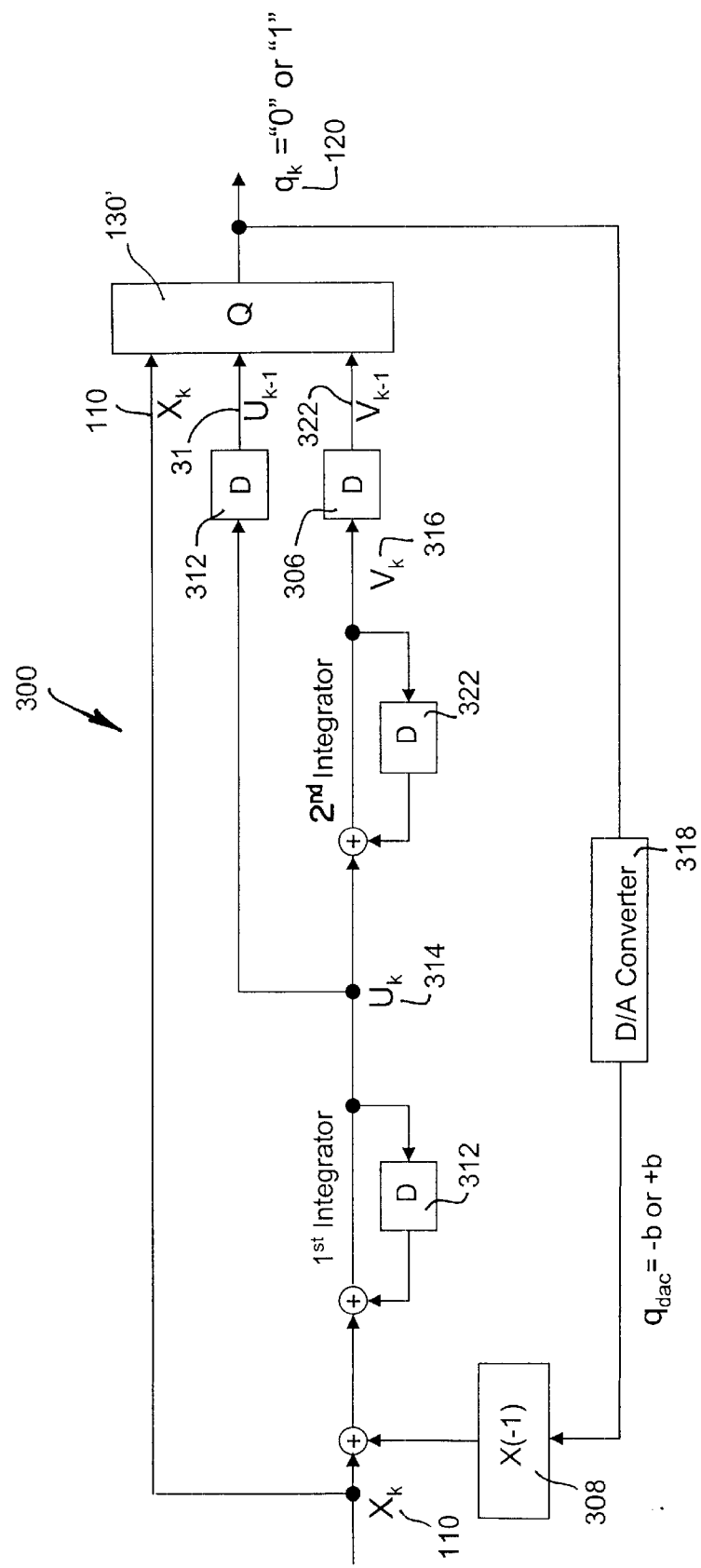
FIG. 8 is another circuit diagram of the operating environment for the ΣΔ modulator according to a preferred embodiment of the present invention.
Figure 9:
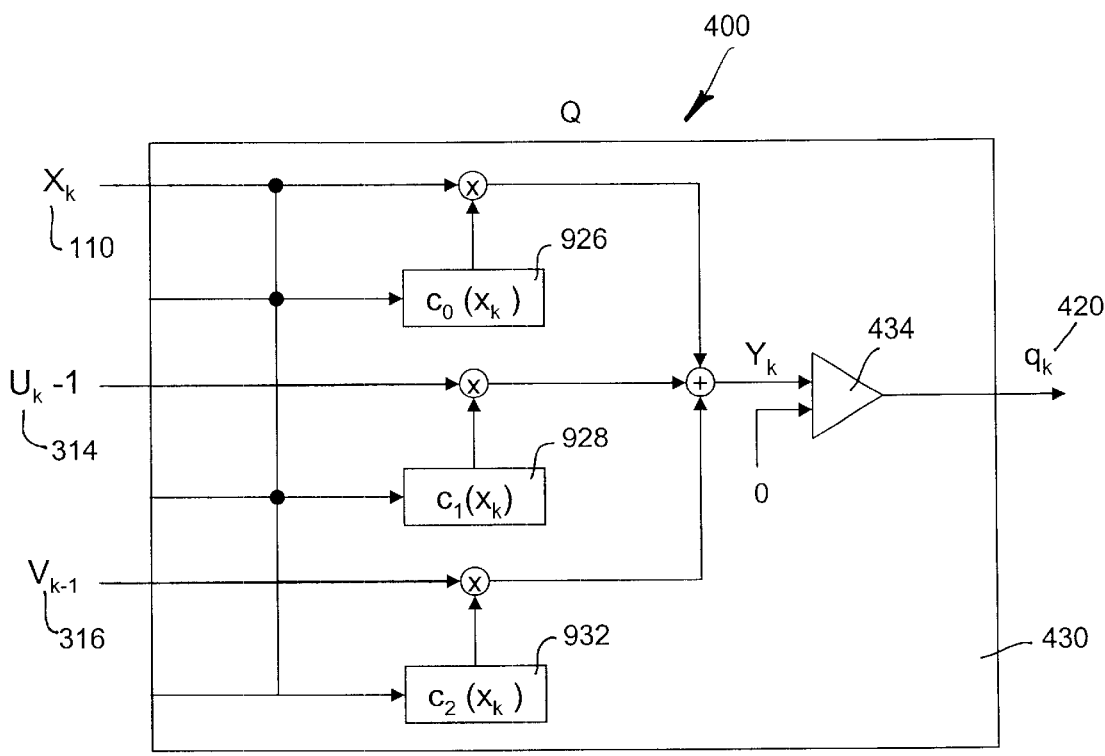
FIG. 9 is an exemplary circuit diagram of the vector quantizer, "Q", displayed in FIG. 8 useful for implementing a preferred embodiment of the present invention.

FIG. 8 depicts another circuit diagram of the operating environment for the ΣΔ A modulator 140 according to a preferred embodiment of the present invention. FIG. 8 resembles in nearly all respects the operating environment depicted in FIG. 3. However, FIG. 8 differs from the operating environment in FIG. 3 in that the $q_{dac}$ equals "−b" or "+b" in FIG. 8 as opposed to "−½" and "+½" as seen in FIG. 3. In essence, the signal's amplitude upon leaving the digital to analog signal converter 318 in FIG. 8 is not constrained to any value, while the signal amplitude in FIG. 3 is constrained to "−½" or "+½."FIG. 9 depicts an exemplary circuit diagram of the vector quantizer 430 when the $q_{dac}$ signal is, as was seen in FIG. 8, not constrained to "−½" or "+½." Similarities exist between FIG. 9 and FIG. 4. Primarily, the circuit components remain in FIG. 9 as was seen before in FIG. 4. However, in FIG. 9, the coefficient boxes represent a different equation set. FIG. 9 demonstrates the circuitry used to implement the equation:

$$Q(x_k, u_{k-1}, v_{k-1}) = \text{quant}[(20b-4|x_k|)x_k + (18b-6|x_k|)u_{k-1} + (12b-12|x_k|)v_{k-1}] \quad \text{(Equation 6)}$$

The values for the coefficient $C_0(x_k)$ 926, $c_1(x_k)$ 928, and $c^2(x_k)$ 932 boxes can be found in the equation list 936.

Figure 10:
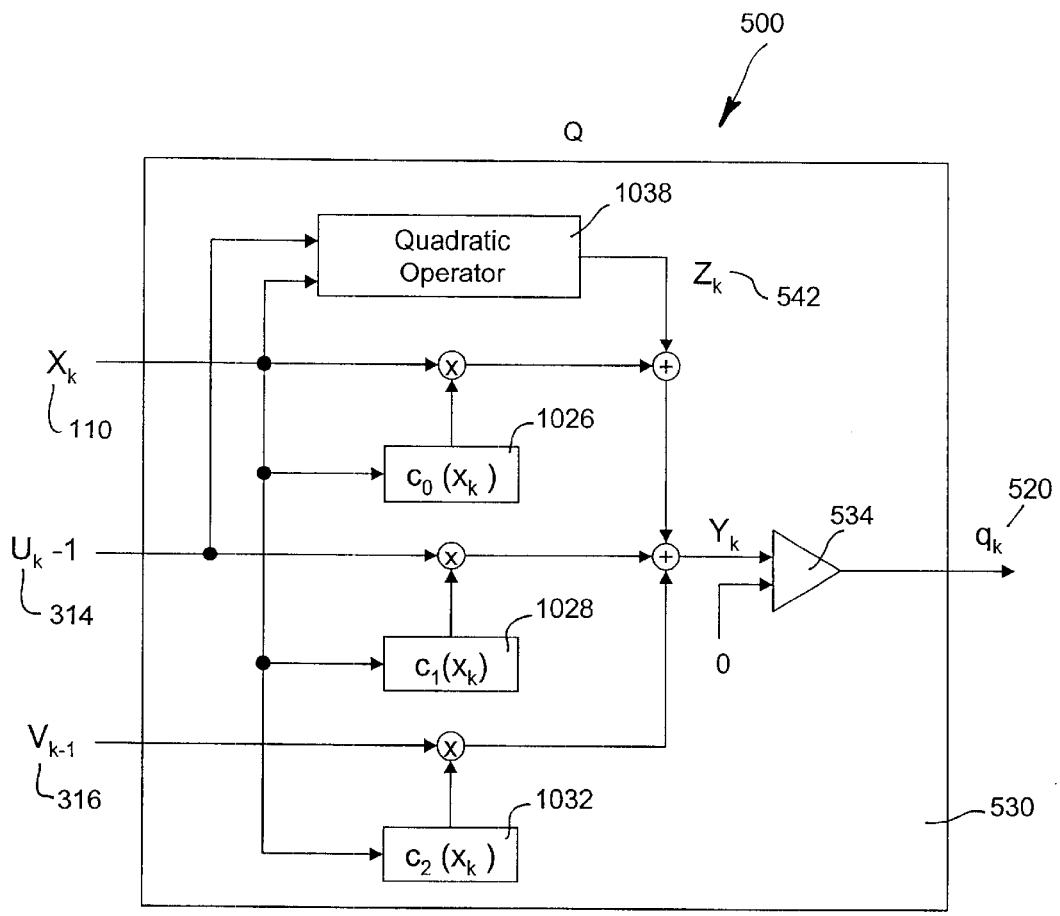
FIG. 10 is another exemplary circuit diagram of the vector quantizer "Q", displayed in FIG. 8 useful for implementing another embodiment of the present invention.

FIG. 10 depicts another exemplary circuit diagram of the vector quantizer 530 when the $q_{dac}$ signal is, as was seen in FIG. 8, not constrained to "−½" or "+½. " FIG. 10 demonstrates the circuitry used to implement the equation:

$$Q(x_k, u_{k-1}, v_{k-1}) = \text{quant}[(14b-3|x_k|)x + (12b-4|x_k|)u_{k-1} + (8b-8|x_k|)v_{k-1} + \text{sign}(x_k)(4(x_k+u_{k-1})^2 - b^2/3)] \quad \text{(Equation 5)}$$

As with FIGS. 8 and 9, FIG. 10 resembles the circuitry depicted in prior diagrams. FIG. 10 most closely resembles the circuitry of FIG. 5. However, in FIG. 10 the coefficient $c_0(x_k)$ 1026, $c_1(x_k)$ 1028, and $c^2(x_k)$ 1032 boxes represent different functions. Those functions are depicted in the equation list 1036.

Figure 11:
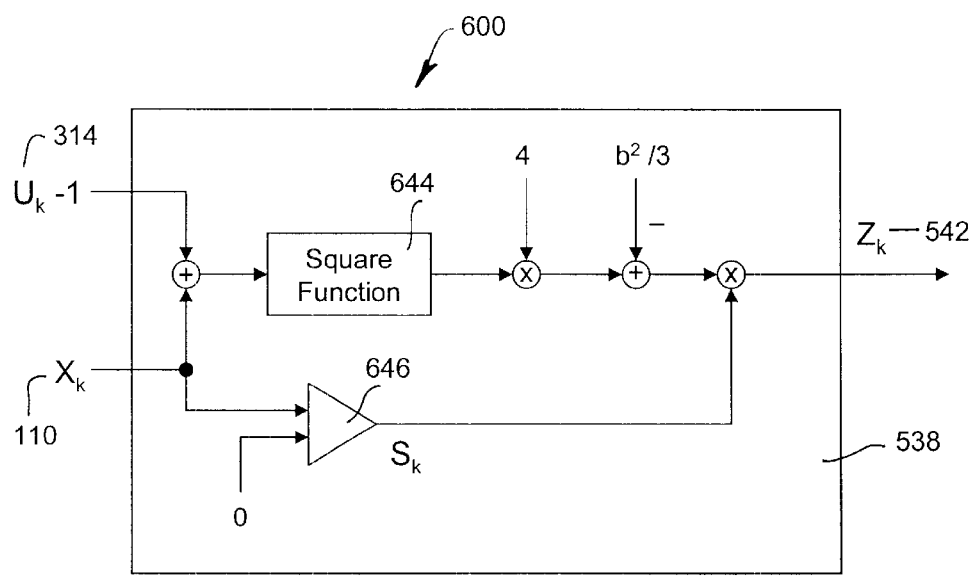
FIG. 11 is an exemplary circuit diagram of the quadratic operator displayed in FIG. 10 useful for implementing an embodiment of the present invention.

FIG. 11 depicts an exemplary circuit diagram of the quadratic operator displayed in FIG. 10. While FIG. 11 resembles the circuit diagram of FIG. 6, rather than subtract 1/12 from $4(u_{k-1}+x_k)^2$ as seen in FIG. 6, in FIG. 1 the circuit subtracts $b^2/3$ from $4(u_{k-1}+x_k)^2$.

I claim:

1. The circuit for determining an amplitude of a set of samples $x_k$, comprising:

a digital to analog converter in a negative feedback loop connected to supply a first integrator input;

a first integrator acting upon the first integrator input and the set of samples $x_k$, to produce a corresponding set of first integrated signals $u_k$;

a second integrator acting upon the set of first integrated signals uk to produce a corresponding set of second integrated signals $v_k$;

timing elements included in a signal path of the first and second integrated signals $u_k$ and $v_k$ to provide a delayed first integrated signal $u_{k-1}$ and a delayed second integrated signal $v_{k-1}$ that are one sample delayed in time relative to the sample $x_k$; and a vector quantizer $Q(x_k, u_{k-1}, v_{k-1})$ configured to provide a binary output $q_k$ in response to the set of samples $x_k$, the delayed first integrated signal $u_{k-1}$, and the delayed second integrated signal $v_{k-1}$ inputs, wherein the vector quantizer $Q(x_k, u_{k-1}, v_{k-1})$ is configured to implement a function:

$$Q(x_k, u_{k-1}, v_{k-1}) = \text{quant}[(10-4|x_k|)x_k + (9-6|x_k|)u_{k-1} + (6-12|x_k|)v_{k-1}]$$

in which $Q(x_k, u_{k-1}, v_{k-1})$ refers to a three input function which produces a binary output based on the inputs $x_k, u_{k-1}$, and $v_{k-1}$ and wherein quant(y)="1" if y>0 and quant(y)="0" if y<0.

2. A circuit for determining an amplitude of a set of samples $x_k$, comprising:

a digital to analog converter in a negative feedback loop connected to supply a first integrator input;

a first integrator acting upon the first integrator input and the set of samples $x_k$, to produce a corresponding set of first integrated signals $u_k$;

a second integrator acting upon the set of first integrated signals $u_k$ to produce a corresponding set of second integrated signals $v_k$;

timing elements included in a signal path of the first and second integrated signals $u_k$ and $v_k$ to provide a delayed first integrated signal $u_{k-1}$ and a delayed second integrated signal $v_{k-1}$ that are one sample delayed in time relative to the sample $x_k$; and a vector quantizer $Q(x_k, u_{k-1}, v_{k-1})$ configured to provide a binary output $q_k$ in response to the set of samples $x_k$, the delayed first integrated signal $u_{k-1}$, and the delayed second integrated signal $v_{k-1}$ inputs wherein the vector quantizer is configured to implement a first function:

$$Q(x_k, u_{k-1}, v_{k-1}) = \text{quant}[(7-3x_k)x + (6-4|x_k|)u_{k-1} + (4-8|x_k|)v_{k-1} + QO(x_k, u_{k-1})]$$

in which the binary output is further determined by a quadratic operator QO $(x_k, u_{k-1})$ configured to implement a second function:

$$QO(x_k, u_{k-1}) = \text{sign}(x_k)(4(x_k+u_{k-1})^2 - 1/12)$$

in which QO $(x_k, u_{k-1})$ refers to a two input function which produces a signed integer output which is either positive or negative, depending upon a quadratic operator comparator's output and wherein quant(y)="1" if y>0 and quant(y)="0" if y<0.

3. A circuit for determining an amplitude of a set of samples $x_k$, comprising:

a digital to analog converter in a negative feedback loop connected to supply a first. integrator input;

a first integrator acting upon the first integrator input and the set of samples $x_k$, to produce a corresponding set of first integrated signals $u_k$;

a second integrator acting upon the set of first integrated signals $u_k$ to produce a corresponding set of second integrated signals $v_k$;

timing elements included in a signal path of the first and second integrated signals $u_k$ and $v_k$ to provide a delayed first integrated signal $u_{k-1}$ and a delayed second integrated signal $v_{k-1}$ that are one sample delayed in time relative to the sample $x_k$; and a vector quantizer $Q(x_k, u_{k-1}, v_{k-1})$ configured to provide a binary output $q_k$ in response to the set of samples $x_k$, the delayed first integrated signal $u_{k-1}$, and the delayed second integrated signal $v_{k-1}$ inputs wherein the vector quantizer is configured to implement a first function:

$$Q(x_k, u_{k-1}, v_{k-1}) = \text{quant}[(14b-3|x_k|)x+(12b-4|x_k|)u_{k-1}+(8b-8|x_k|)v_{k-1}+QO(x_k, u_{k-1})]$$

in which the binary output is further determined by a quadratic operator QO $(x_k, u_{k-1})$ configured to implement a second function:

$$QO(x_k, u_{k-1}) = \text{sign}(x_k)(4(x_k+u_{k-1})^2 - b^2/3)$$

in which QO $(x_k, u_{k-1})$ refers to a two input function which produces a signed integer output which is either positive or negative, depending upon a quadratic operator comparator's output and wherein quant(y)="1" if y>0 and quant(y)="0" if y<0.

4. The circuit for determining an amplitude of a set of samples $x_k$, comprising:

a digital to analog converter in a negative feedback loop connected to supply a first integrator input;

a first integrator acting upon the first integrator input and the set of samples $x_k$, to produce a corresponding set of first integrated signals $u_k$;

a second integrator acting upon the set of first integrated signals $u_k$ to produce a corresponding set of second integrated signals $v_k$;

timing elements included in a signal path of the first and second integrated signals $u_k$ and $v_k$ to provide a delayed first integrated signal $u_{k-1}$ and a delayed second integrated signal $v_{k-1}$ that are one sample delayed in time relative to the sample $x_k$; and a vector quantizer $Q(x_k, u_{k-1}, v_{k-1})$ configured to provide a binary output $q_k$ in response to the set of samples $x_k$, the delayed first integrated signal $u_{k-1}$, and the delayed second integrated signal $v_{k-1}$ inputs, wherein the vector quantizer $Q(x_k, u_{k-1}, v_{k-1})$ is configured to implement a function:

$$Q(x_k, u_{k-1}, v_{k-1}) = \text{quant}[(20b-4|x_k|)x_k+(18b-6|x_k|)u_{k-1}+(12b-12|x_k|)v_{k-1}]$$

in which $Q(x_k, u_{k-1}, v_{k-1})$ refers to a three input function which produces a binary output based on the inputs $x_k$, $u_{k-1}$, and $v_{k-1}$ and wherein quant(y)="1" if y>0 and quant(y)="0" if y<0.

\* \* \* \* \*